(12) United States Patent
Chen et al.

(10) Patent No.: US 7,942,195 B2
(45) Date of Patent: May 17, 2011

(54) HEAT DISSIPATION DEVICE HAVING A BRACKET

(75) Inventors: Yong-Dong Chen, Shenzhen (CN); Bo-Yong Yang, Shenzhen (CN); Guang Yu, Shenzhen (CN); Shih-Hsun Wung, Tucheng (TW); Chun-Chi Chen, Tucheng (TW)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 1464 days.

(21) Appl. No.: 11/308,250

(22) Filed: Mar. 14, 2006

(65) Prior Publication Data

US 2007/0215319 A1 Sep. 20, 2007

(51) Int. Cl.
*F28F 7/00* (2006.01)
*F28D 15/00* (2006.01)

(52) U.S. Cl. .............. 165/80.4; 165/80.2; 165/104.21; 165/104.33; 29/890.032

(58) Field of Classification Search ............... 165/80.2, 165/80.3, 80.4, 104.21, 104.33; 29/890.032
See application file for complete search history.

(56) References Cited

U.S. PATENT DOCUMENTS

| | | | |
|---|---|---|---|
| 6,918,429 B2 * | 7/2005 | Lin et al. | 165/104.21 |
| 6,940,717 B2 | 9/2005 | Shih-Tsung | |
| 7,013,960 B2 * | 3/2006 | Lee et al. | 165/104.33 |
| 7,128,131 B2 * | 10/2006 | Kubo | 165/80.3 |
| 7,254,023 B2 * | 8/2007 | Lu et al. | 165/80.2 |
| 2003/0005584 A1 * | 1/2003 | Komatsu et al. | 29/890.032 |
| 2003/0183373 A1 | 10/2003 | Sarraf | |
| 2006/0144572 A1 * | 7/2006 | Yu et al. | 165/104.33 |

\* cited by examiner

*Primary Examiner* — Ljiljana (Lil) V Ciric
(74) *Attorney, Agent, or Firm* — Jeffrey T. Knapp

(57) ABSTRACT

A heat dissipation device (10) includes a first heat sink (20), a second heat sink (30) and a heat pipe (40) transferring heat from the first heat sink to the second heat sink. A bracket (50) includes a first end (51) attached to the first heat sink and a second end (52) attached to the second heat sink.

15 Claims, 2 Drawing Sheets

HEAT DISSIPATION DEVICE HAVING A BRACKET

FIELD OF THE INVENTION

The present invention relates to a heat dissipation device with two heat sinks for electronics particularly a heat dissipation device having a bracket to fix and interconnect the two heat sinks.

DESCRIPTION OF RELATED ART

With the continued development of computer technology, electronic packages such as computer central processing units (CPUs) are generating more and more heat that needs to be dissipated immediately to avoid damage to the circuitry. Conventional heat dissipating devices such as heat sinks mounted onto the CPU are not sufficiently effective at dissipating heat to cope with modern circuitry. New heat dissipation devices featuring twin heat sinks are increasingly being used to enhance efficiency of these electronic packages. US Publication No. 2003/0183373 A1 shows an example of this kind of heat dissipation device. The heat dissipation device includes a first heat sink, a second heat sink and a heat pipe conducting heat from the first heat sink to the second heat sink. However, this type of the heat dissipation device is not sturdy. The two heat sinks only interconnect via the heat pipe. When an external force acts on heat dissipation device, the heat pipe is likely to deform, thereby reducing the heat transfer performance of the heat pipe and thus also reducing the heat dissipating efficiency of the whole heat dissipation device.

SUMMARY OF INVENTION

According to a preferred embodiment of the present invention, a heat dissipation device comprises a first heat sink, a second heat sink and a heat pipe transferring heat from the first heat sink to the second heat sink. A bracket includes a first end attached to the first heat sink and a second end attached to the second heat sink, thus enhancing the strength and stability of the heat dissipation device.

Other advantages and novel features of the present invention will become more apparent from the following detailed description of the preferred embodiment when taken in conjunction with the accompanying drawings, in which:

DETAILED DESCRIPTION

Figure 1:
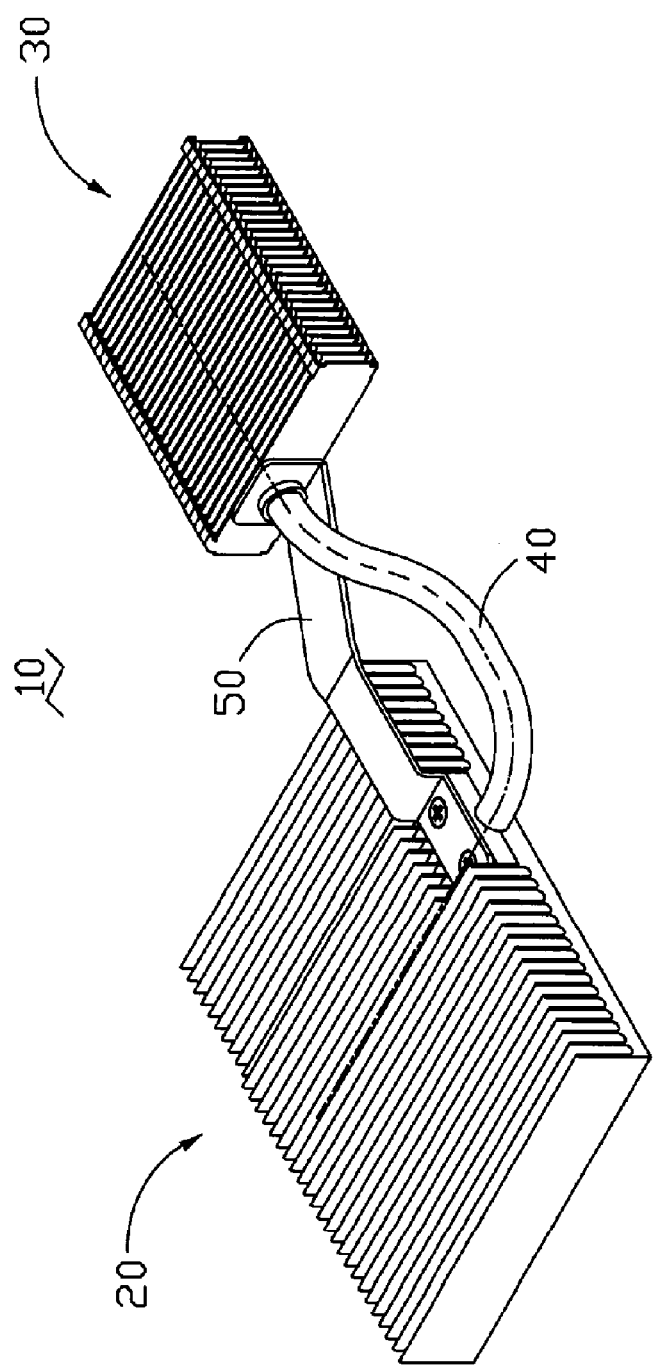
FIG. 1 is an assembled view of a heat dissipation device according to a preferred embodiment of the present invention.
Figure 2:
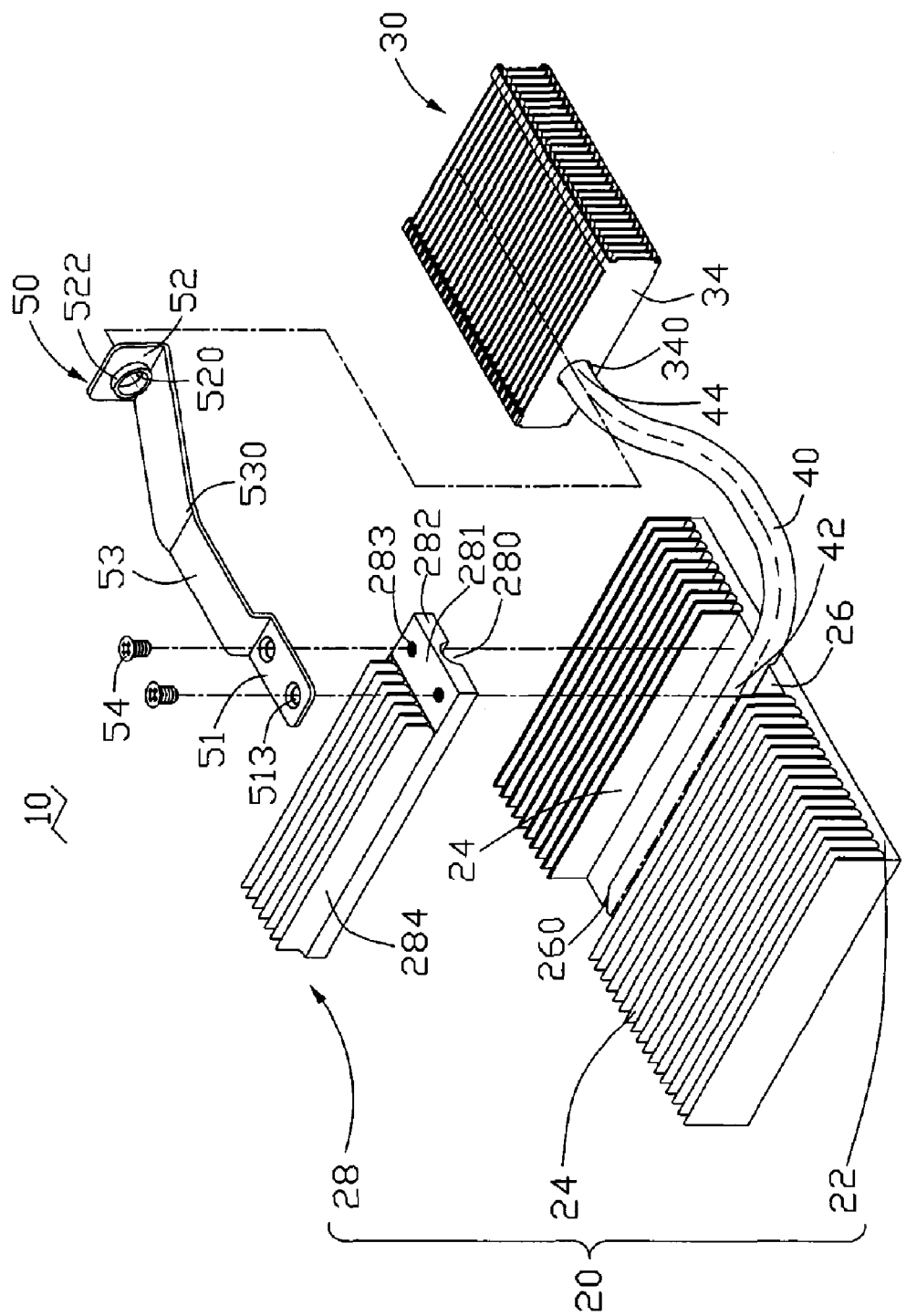
FIG. 2 is an exploded, isometric view of FIG. 1.

Referring to FIGS. 1-2, a heat dissipation device 10 in accordance with a preferred embodiment of the present invention is illustrated. The heat dissipation device 10 mainly comprises a first heat sink 20, a second heat sink 30 and a heat pipe 40 conducting heat from the first heat sink 20 to the second heat sink 30. A bracket 50 connects the first heat sink 20, the heat pipe 40 and the second heat sink 30, so as to reinforce the whole structure of the heat dissipation device 10.

The first heat sink 20 comprises a base 22, two spaced groups of fins 24 extending upwardly from the base 22 and a separating member 28 mounted between the two groups of fins 24. A connection area 26 of the base 22 is formed between the two groups of fins 24. A groove 260 is defined in the connection area 26 of the base 22 for receiving an evaporating portion 42 of the heat pipe 40. The separating member 28 is mounted on the connection area 26 of the first heat sink 20. The separating member 28 comprises a base 282 parallel to the base 22 and a plurality of fins 284 extending upwardly from the base 282 thereof. Each of the fins 284 is parallel to each of the fins 24 of the first heat sink 20. The base 282 of the separating member 28 has a same length as the base 22 of the first heat sink 20 along a lateral direction. A length of the fins 284 is shorter than that of the base 282 such that a mating area 281 is formed at a top edge of the base 282. A pair of threaded holes 283 is defined in the mating area 281 of the base 282. A groove 280 corresponding to the groove 260 is defined in a bottom of the base 282. The groove 280 and the groove 260 cooperatively form a channel for receiving the evaporating portion 42 of the heat pipe 40.

The second heat sink 30 comprises a plurality of fins 34 spaced from and snapped (i.e. connected) with each other. The fins 34 are perpendicular to the base 22 of the first heat sink 20. A through hole 340 is defined in the fins 34 for receiving a condensing portion 44 of the heat pipe 40.

The bracket 50 is made from any high strength material such as metal, metal alloy, plastic or any other suitable material. The bracket 50 comprises two free ends 51, 52 and a connecting arm 53. The free end 51 parallel to the base 22 of the first heat sink 20 is mounted on the mating area 281 of the separating member 28 of the first heat sink 20 and the free end 52 parallel to the fins 34 of the second heat sink 30 is mounted on the second heat sink 30. The free end 51 defines a pair of mounting holes 513 corresponding to the threaded holes 283 of the mating area 281 of the first heat sink 20. The free end 52 is substantially perpendicular to the free end 51, and defines a through hole 520 therein. The through hole 520 has an annular sidewall 522 extending perpendicularly from an edge thereof. The connecting arm 53 has a bend 530 at a substantially central portion thereof.

In assembly, the grooves 280, 260, the connection area 26, an inner surface of the through hole 340 and the sidewall 522 are coated with solder. The evaporating portion 42 of the heat pipe 40 is soldered into the channel of the first heat sink 20 formed by the grooves 260, 280. The free end 52 of the bracket 50 abuts against a lateral side of an outmost fin 34 of the second heat sink 30 near the first heat sink 20 and the through hole 520 of the bracket 50 is aligned with the through hole 340 of the second heat sink 30. The condensing portion 44 of the heat pipe 40 is brought to extend in the through holes 340, 520 and is soldered therein so that the second heat sink 30 and the bracket 50 are connected together via the condensing portion 44 of the heat pipe 40 soldered to the free end 52 of the bracket 50 and the fins 34. The free end 51 of the bracket 50 is positioned on the mating area 281 of the separating member 28 of the first heat sink 20. A pair of screws 54 extends through the mounting holes 513 of the bracket 50 and screw into the threaded holes 283 of the first heat sink 20. Thus the first heat sink 20 and the second heat sink 30 are immovably connected together. In a further preferred embodiment, the free end 52 is also soldered to the lateral side of the outmost fin 34 of the second heat sink 30.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device comprising:
a first heat sink;
a second heat sink spaced from the first heat sink;
a heat pipe transferring heat from the first heat sink to the second heat sink, the heat pipe comprising an evaporating portion connecting with the first heat sink and a condensing portion connecting with the second heat sink; and
a bracket comprising a first end fixed to the first heat sink and a second end fixed to the second heat sink, for reinforcing the heat dissipation device;
wherein the condensing portion of the heat pipe is soldered in the second heat sink;
wherein the first end of the bracket is fixed to the first heat sink with at least one screw; and
wherein the second end of the bracket is soldered to the condensing portion of the heat pipe.

2. The heat dissipation device as described in claim 1, wherein a through hole is defined in the second heat sink for receiving the condensing portion of the heat pipe.

3. The heat dissipation device as described in claim 2, wherein the second end defines a through hole aligned with the through hole of the second heat sink.

4. The heat dissipation device as described in claim 3, wherein the through hole of the second end of the bracket has an annular sidewall extending perpendicularly from an edge thereof and the condensing portion of the heat pipe is soldered to the annular sidewall.

5. The heat dissipation device as described in claim 1, wherein the first end of the bracket is substantially perpendicular to the second end.

6. The heat dissipation device as described in claim 1, wherein the bracket comprises a connecting arm connecting the first end and the second end, and the connecting arm has a bend at a substantially central portion thereof.

7. The heat dissipation device as described in claim 1, wherein the first heat sink comprises a base, two spaced groups of fins extending from the base and a separating member mounted between the two groups of fins.

8. The heat dissipation device as described in claim 7, wherein the separating member comprises a base mounted on the base of the first heat sink and a plurality of fins extending upwardly from the base of the separating member.

9. The heat dissipation device as described in claim 7, wherein the evaporating portion of the heat pipe is soldered between the base and the separating member.

10. The heat dissipation device as described in claim 9, wherein the first end of the bracket is mounted on the separating member.

11. A heat dissipation device comprising:
a first heat sink comprising a base for contacting a heat source;
a second heat sink spaced from the first heat sink;
a heat pipe comprising an evaporating portion connecting with the first heat sink and a condensing portion connecting with the second heat sink; and
a bracket interconnecting the first heat sink and the second heat sink, for enhancing the strength and stability of the heat dissipation device;
wherein the bracket comprises a first end screwed to the first heat sink, a second end soldered to the second heat sink and a connecting arm connecting the first end and the second end.

12. The heat dissipation device as described in claim 11, wherein the connecting arm has a bend at a substantially central portion thereof.

13. The heat dissipation device as described in claim 11, wherein the second heat sink comprises a plurality of fins and the condensing portion of the heat pipe is soldered in the fins.

14. The heat dissipation device as described in claim 13, wherein the first end is parallel to the base of the first heat sink, and the second end is parallel to the fins of the second heat sink.

15. A heat dissipation device comprising:
a first heat sink adapted for contacting a heat-generating electronic device;
a second heat sink spaced from the first heat sink;
a heat pipe interconnecting the first heat sink and the second heat sink for transferring heat from the first heat sink to the second heat sink, the heat pipe comprising an evaporating portion connecting with the first heat sink and a condensing portion connecting with the second heat sink; and
a bracket having a first end secured to the first heat sink and a second end secured to the second heat sink and the heat pipe;
wherein the condensing portion of the heat pipe is soldered in the second heat sink and the second end of the bracket.

* * * * *